(12) United States Patent
Deutscher et al.

(10) Patent No.: US 8,664,163 B2
(45) Date of Patent: Mar. 4, 2014

(54) HIGH TEMPERATURE SUPERCONDUCTIVE FILMS AND METHODS OF MAKING THEM

(75) Inventors: Guy Deutscher, Herzliya (IL); Mishael Azoulay, Kfar-Saba (IL); Boaz Almog, Rehovot (IL)

(73) Assignee: Ramot at Tel-Aviv University Ltd., Tel Aviv (IL)

( * ) Notice: Subject to any disclaimer, the term of this patent is extended or adjusted under 35 U.S.C. 154(b) by 659 days.

(21) Appl. No.: 12/687,139

(22) Filed: Jan. 14, 2010

(65) Prior Publication Data
US 2010/0298150 A1 Nov. 25, 2010

Related U.S. Application Data

(60) Provisional application No. 61/144,784, filed on Jan. 15, 2009.

(51) Int. Cl.
*H01L 39/24* (2006.01)
(52) U.S. Cl.
USPC ........................................ 505/237; 505/238
(58) Field of Classification Search
USPC .................... 505/230, 237, 238; 428/699–701
See application file for complete search history.

(56) References Cited

U.S. PATENT DOCUMENTS

| | | | | |
|---|---|---|---|---|
| 5,739,086 A | * | 4/1998 | Goyal et al. | 505/473 |
| 5,741,377 A | * | 4/1998 | Goyal et al. | 148/512 |
| 5,898,020 A | * | 4/1999 | Goyal et al. | 505/239 |
| 5,958,599 A | * | 9/1999 | Goyal et al. | 428/457 |
| 7,208,196 B2 | * | 4/2007 | Sambasivan et al. | 427/248.1 |
| 2004/0096707 A1 | * | 5/2004 | Sambasivan et al. | 428/698 |
| 2007/0042127 A1 | * | 2/2007 | Hammond et al. | 427/457 |
| 2009/0081456 A1 | | 3/2009 | Goyal | |
| 2009/0082211 A1 | * | 3/2009 | Nakayama et al. | 505/237 |

OTHER PUBLICATIONS

Klein et al.; "The Effective Microwave Surface Impedance of high-Tc Thin Films"; Journal of Applied Physics; Jun. 1, 1990; pp. 6940-6945;vol. 67; American Institute of Physics, USA.
Kastner et al.; "Microcracks Observed in Epitaxial Thin Films of . . . "; Phys. Stat. Sol.; 1995;pp. 381-394; vol. 150.
Zaitsev et al; "Abstract of 'Critical Thickness of YBCO films in CeO2 Buffered Sapphire"; Applied Superconductivity; 1997; pp. 25-28; vol. 158.
Zaitsev et al; "Large Area YBa2Cu3O7 Films on Sapphire with Excellent Microwave Power Handling Capability"; Journal of Superconductivity; 1998; pp. 361-365; vol. 11, No. 3.
R. Wordenweber; "Growth of high-Tc Thin Films"; Superconductor Science and Technology; 1999; pp. R86-R102; vol. 12.
Zuccaro et al.; "Nonlinear Microwave Losses of Large Area YBCO thin films"; Inst. Phys. Conf.; 1997; pp. 295-298.

(Continued)

*Primary Examiner* — Colleen Dunn
(74) *Attorney, Agent, or Firm* — The Law Office of Michael E. Kondoudis

(57) ABSTRACT

Described is an article including a sapphire substrate carrying a superconductive layer of a compound of the formula $YBa_2Cu_3O_{7-x}$ (YBCO), the layer having surface area of at least 10 cm$^2$, and critical current of at least 100 A/cm width at a temperature of 77K or higher. In one exemplary embodiment, the thickness of the superconductive layer is between 10 nm and 50 nm. In another exemplary embodiment, the thickness of the superconductive layer is more than 600 nm. In preferred embodiment, an YSZ layer and a non-superconductive YBCO layer separate between the superconductive layer and the substrate.

9 Claims, 10 Drawing Sheets

(56) References Cited

OTHER PUBLICATIONS

Wordenweber et al.; "Large-area YBCO Films on Sapphire for Microwave Applications"; IEEE Transactions on Applied Superconductivity; Jun. 1999; pp. 2486-2491; vol. 9, No. 2.

Develos-Bagarinao et al.; "Multi-layered Structures of (RE = rare earth) Ba2Cu3Ox films: an Approach for the Growth of Superior Quality Large-Area Superconducting Films on Sapphire Substrates"; Superconductor Science and Technology; 2007; pp. L25-L29; 20.

Develos-Bagarinao et al.; "Thickness Dependence of Jc for YBCO thin films Prepared by Large-area Pulsed Laser Deposition on CeO2-Buffered Sapphire Substrates";Superconductor Science and Technology; 2005; pp. 667-674; vol. 18.

Drozdov et al.; "Microstructures and Electrical Properties of YBCO Films"; Superconductor Science and Technology; 1996; pp. A166-A169;vol. 9.

Rao et al.; "Microstructural Study of Yttria Stabilized Zirconia Buffered Sapphire for YBa2Cu3O7 Thin Films"; Journal of Applied Physics; Jan. 15, 1996; pp. 940-946; vol. 79.

Krupke et al.; "A Systematic Approach to Reduce Macroscopic Defects in c-axis-oriented YBCO Films"; Physica C; 1999; pp. 536-539.

Almog et al.; "Characterization of Large Size YBa2Cu3O7 Films Using Magnetic Field Penetration"; Superconductor Science and Technology; 2005; pp. 1441-1444; vol. 18.

Almog et al.; "Homogenous Crack-free Large Size YBCO/YSZ/Sapphire Films for Application"; 24th International Conference on Low Temperature Physics; 2006; pp. 471-472.

Goyal et al.; "Epitaxial Growth of Superconductors of SSIFFS"; Presented at the High Temperature Superconductivity Program Peer Review of the US DOE; Jul. 30, 2008; Available at http://www.htspeerreview.com/2008/pdfs/presentations/wednesday/research/1%20SR%20Strategic%20Substrate%20Development%20for-%20Coated%20Conductors.pdf.

\* cited by examiner

HIGH TEMPERATURE SUPERCONDUCTIVE FILMS AND METHODS OF MAKING THEM

CROSS-REFERENCE TO RELATED APPLICATION

This application claims the benefit of priority from U.S. Provisional Patent No. 61/144,784, filed Jan. 15, 2009.

FIELD OF THE INVENTION

This invention relates to temperature superconductive films and method of fabrication of such films.

BACKGROUND OF THE INVENTION

The current inventors reported, in the 24th International Conference on Low Temperature Physics—LT24 Conference Proceedings 850, 471 (2006), the growth of high quality, large size, crack free films of YBCO ($YBa_2Cu_3O_{7-x}$) on top of r-cut Sapphire with a buffer layer of YSZ (Yttrium-stabilized $ZrO_2$).

According to this report, both YSZ and YBCO layers were grown by off axis dc magnetron sputtering from stoichiometric single targets. The YSZ layer was sputtered at 5 mTorr of Ar with the substrate at 955° C. The thickness of the YSZ was 100 nm, deposited at a deposition rate of 0.01 nm/sec. During the sputtering of YBCO the heater temperature was 930° C. The substrate was heated by IR radiation and its temperature was estimated as 750° C. The gas mixture was 50/50 percent oxygen and argon at 200 mTorr. The dc power on the target was 140 W, yielding a sputtering rate of about 0.03 nm/sec. An annealing process in pure oxygen was performed for 16 hours at approximately 500° C.

The thickest layer reported was about 1000 nm thick, and had critical current density of about 0.2 $MA/cm^2$ (See FIG. 3 of the report), which at the given thickness is equivalent to critical current of 20 A per cm width.

Other publications that may serve for understanding the background of the invention include:

1. N. Klein et al., *J. Appl. Phys.* 67, 6940 (1990).
2. G. Kästner et al., *Phys. Stat. Sol.* (a) 150, 381 (1995).
3. A. G. Zaitsev et al., *Applied Superconductivity: Inst. Phys. Conf Ser.* 158, 25 (1997).
4. A. G. Zaitsev et al. *J. Supercond.* 11, 361 (1998).
5. R. Wördenweber, *Supercond. Sci. Technol.* 12, 86 (1999).
6. C. Zuccaro et al., *IEEE Trans. Appl. Supercond.* 1, 295 (1997).
7. R. Wordenweber et al., IEEE Transactions on Applied Superconductivity 9, 2486 (1999).
8. K. Develos-Baraginao et al., Supercond. Sci. and Tech. 20, L25 (2007).
9. K. Develos-Baraginao et al., Supercond. Sci. and Tech. 18, 667 (2005).
10. Yu N. Drozdov et al., Supercond. Sci. Tech. 9, A166 (1996).
11. M. S. Rao et al., J. Appl. Phys. 79, 940 (1996).
12. R. Krupke et al., Physica C 317-318, 536 (1999).
13. B. Almog et al., Supercond. Sci. Technol. 18 (2005) 1441-1444
14. "Epitaxial Growth of Superconductors of SSIFFS" by Goal et al., presented at High Temperature Superconductivity program Peer Review of the USA Department of Energy on Jul. 30, 2008, available on the Internet at http://www.energetics.com/supercon08/pdfs/presentations/wednesday/research/1%20SR%20Strategic%20Substrate%20Development%20for%20Coated%20Conductors.pdf

GENERAL DESCRIPTION

An aspect of some embodiments of the invention concerns a thick superconductive layer of high critical current density.

In some preferred embodiments, the layer is superconductive at temperatures above at least 77K. Optionally, the layer is superconductive at temperatures up to 90K.

In the context of the present description and claims, a layer is considered superconductive if electric currents of up to 1 $A/cm^2$ flow through the layer without any potential difference, or if higher currents are associated with potential difference of 1 μV/cm or less. The smallest current, at which a greater potential difference is developed is referred to as critical current, above which the layer is not superconductive.

The layer has two large dimensions (hereinafter length and width), and one small dimension, referred to as thickness. Optionally, a layer is considered thick if its thickness is 600 nm or more, for instance, 600 nm, 800 nm, 950 nm, 1000 nm, 1200 nm, or intermediate or larger thickness.

In some preferred embodiments, the surface area of the superconductive layer is 10 $cm^2$ or more, for instance, 10, 25, 50, 75, 100 $cm^2$, or intermediate or larger surface areas.

In some preferred embodiments, the layer thickness is larger than 100 nm and the critical current is at least 100 A per cm width, for example, 200 A per cm width. Thus, there is provided in accordance with an exemplary embodiment of the invention a superconductive layer having a surface area of at least 10 $cm^2$, thickness of at least 600 nm, and critical current of at least 100 A/cm width at a temperature of 77K or higher.

Optionally, the superconductive layer is grown on a substrate. In some preferred embodiments, the substrate comprises an r-cut single crystal of sapphire. Optionally, the substrate is an r-cut sapphire wire, as described in Ref 14. Optionally, the YSZ is grown on an r-plane defined by one of the following Miller-Bravais indices: [1 –1 0 2] or [1 0 1 2]. In some exemplary embodiments of the invention, the layer is attached to a 500 μm thick sapphire single crystal. Other examples of substrate thickness include 250 μm and 750 μm. Thicker substrates are more robust, and thinner substrates are more flexible and less fragile.

In some preferred embodiments, there is a protective layer between the substrate and the superconductive layer. A layer is referred to as protective if it decreases the diffusion rate of atoms, for instance aluminum atoms, from the substrate to the superconductive layer. In exemplary embodiments, diffusion of aluminum towards the superconductive layer is practically prevented by the protective layer.

An exemplary protective layer is a layer of YSZ. Optionally, the thickness of an YSZ protective layer is 50-200 nm.

In some exemplary embodiments of the invention, the superconductive layer is of $YBa_2Cu_3O_{7-x}$, which is also known as YBCO. The parameter x used in the formula of YBCO is a rational number between 0 and 7. There is at least one range, for example, between about 0.05 and about 0.3, wherein YBCO is superconductive. When x has a value out of such range, for example, when x>1, YBCO is not superconductive. An YBCO layer with x out of the superconductivity range will be referred herein as a non-superconductive layer.

In some exemplary embodiments of the invention, there is a template layer between the superconductive layer and the substrate, optionally between the superconductive layer and the protective layer. Optionally, the structure of the template layer fits that of the protective layer more closely than does the structure of the superconductive layer. This way, the template provides an intermediate layer having an intermediate structure, and allows thicker layers of superconductive YBCO to grow, than are grown without the template. In exemplary embodiments, such fit between the template layer and the YSZ layer is achieved when the template layer comprises non-superconductive YBCO, for example, YBCO with c-lattice parameter greater than 1.175 nm. Exemplary values of c parameters of template layers are between 1.178 and 1.180 nm, which correspond to x values of between about 0.8 and about 0.9.

In some embodiments, the value of x in the template layer is constant, and there is a sharp border between the template layer and the superconductive layer. In some embodiments, the value of x in the template layer is not constant. For example, in some embodiments the value of x progresses continuously from below 1 to about 0.1.

An aspect of some embodiments of the invention concerns a method of making an YBCO superconductive layer on a sapphire substrate. In preferred embodiments, the method comprises deposition of superconductive YBCO layer to an r-cut sapphire substrate. In an exemplary embodiment, the deposition is carried out such that an YBCO template layer is deposited between the substrate and the superconductive layer, and this template layer has a structure that fits the structure of the layer on which it grows better than does the superconductive YBCO layer. Optionally, the obtained template layer is as described above.

In an exemplary embodiment, deposition comprises sputtering molecules from a superconducting YBCO target to the substrate. Template and superconductive layers are optionally obtained by sputtering first in an atmosphere having a lower partial pressure of oxygen (for example, 15-20% oxygen), and then in atmosphere of higher partial pressure of oxygen (for example, 55-60% oxygen).

Optionally, sputtering YBCO in atmosphere having the lower partial pressure of oxygen results in the formation of a template layer on the substrate. Additionally or alternatively, sputtering YBCO in atmosphere having the higher partial pressure of oxygen results in the formation of a superconductive layer on the substrate.

Optionally, forming the superconductive layer comprises continuous sputtering. Alternatively, forming the superconductive layer comprises intermittent sputtering, for example, two hours of sputtering followed by two hours intermission without sputtering, followed by additional two hours of sputtering. Optionally, the temperature of the substrate and the atmosphere during the intermission is the same as during sputtering.

Optionally, sputtering of the template layer and sputtering of the superconductive layer is at the same furnace temperature. This furnace temperature is optionally set such that a thermocouple whose position can be adjusted, is attached to the surface of the substrate before the sputtering begins reads a predetermined temperature. The temperature read by the thermocouple is referred to herein as the substrate temperature, although it is possible that the reading of the thermocouple is influenced also by radiation from the furnace, which heats the thermocouple through the transparent substrate. When sputtering begins (after the thermocouple is removed from the substrate's surface) the furnace temperature is controlled by a thermocouple inside the furnace to stay at the same temperature it had at the moment of measurement by the retractable thermocouple.

Optionally, the furnace temperature during template layer sputtering corresponds to substrate temperature (as defined above) of between about 650° C. and about 680° C.

Optionally, the conditions for depositing the template layer are set in accordance with YBCO phase diagram, for example, at the above temperature range, sputtering of the template layer is at a pressure of between 40 and 80 mTorr.

Optionally, sputtering of the superconductive layer at the above temperature range is at a pressure of between 75 and 85 mTorr.

Generally, lower deposition rate results in more ordered layers. Optionally, deposition rate under the lower oxygen content is such that the YBCO template layer grows in 0.02-0.04 nm per second. Optionally, deposition rate under the higher oxygen content is such that the YBCO superconductive layer grows in between about 0.015 and about 0.03 nm per second.

In some preferred embodiments, the deposition is stopped without renewing when the superconductive layer has thickness of 600 nm or more.

In some other preferred embodiments, the deposition is stopped without renewing when the superconductive layer has thickness of between 10 nm and 50 nm.

Optionally, the deposition is stopped without renewing when the superconductive layer is of an intermediate thickness of between 50 nm and 600 nm.

Optionally, after the deposition is stopped without renewing, the obtained layer is exposed to ambient conditions.

In some preferred embodiments of the invention, the sapphire substrate comprises a protective layer, and the deposition is on the protective layer.

Optionally, depositing comprises sputtering.

Optionally, the protective layer comprises YSZ.

In some embodiments of the invention, a method of making a superconducting layer of YBCO on sapphire substrate comprises forming on the sapphire substrate a protective layer of YSZ. Optionally, the furnace temperature during YSZ sputtering corresponds to substrate temperature (as defined above) of between about 890° C. and about 930° C. In some embodiments, this temperature corresponds to substrate temperature of between 905 and 915° C., for example, 910° C.

Alternatively or additionally, a method of making a superconducting layer of YBCO on sapphire substrate comprises providing an YSZ-protected substrate.

An aspect of some embodiments of the invention concerns a method of making an YSZ-protected sapphire substrate. In a preferred embodiment, the method comprises sputtering YSZ on a sapphire substrate at a temperature of between 905 and 915° C. to obtain the protected substrate.

Optionally, the method also comprises cooling the protected substrate to ambient temperature, for example between −10° C. to 40° C., optionally between 20 and 30° C. Alternatively or additionally, the method also comprises exposing the protected layer to atmospheric pressure. Alternatively or additionally, the method also comprises exposing the protected substrate to ambient atmosphere. In this context, ambient atmosphere comprises air. Optionally, ambient atmosphere also comprises water vapor.

An aspect of some embodiments of the invention concerns YSZ-protected sapphire substrate held under ambient conditions. Optionally, the ambient conditions comprise temperature of below 50° C., for example 20-30° C. Alternatively or additionally, the ambient conditions comprise atmospheric pressure. Optionally, the ambient conditions comprise atmosphere comprising air with or without water vapor.

An aspect of some embodiments of the invention concerns a very thin superconductive layer. Optionally, a layer is considered very thin if its thickness is 50 nm or smaller. Optionally, the layer is under ambient conditions.

In some preferred embodiments, the layer is superconductive at temperatures of 77K or above, optionally up to 90K.

The size of a very thin superconductive layer is optionally the same as those of a thick superconductive layer, as described above.

In some preferred embodiments, critical current of a very thin superconductive layer is above 10 A per cm width. Optionally, the superconductive layer is grown on a substrate. In some preferred embodiments, the substrate is as described above in the context of the thicker layers.

In some preferred embodiments, there is a protective layer between the substrate and the superconductive layer, as described above in the context of the thicker layers.

In some exemplary embodiments of the invention, there is a template layer between the superconductive layer and the substrate, optionally as described above in the context of the thicker layers.

Thus, in accordance with an exemplary embodiment of the invention, there is provided an article comprising a sapphire substrate carrying a superconductive layer of a compound of the formula $YBa_2Cu_3O_{7-x}$ (YBCO), the layer having surface area of at least 10 $cm^2$, thickness of at least 600 nm, and critical current of at least 100 A/cm width at a temperature of 77K or higher. Optionally, the superconductive layer has surface area of up to 100 $cm^2$. Optionally, the superconductive layer has thickness of up to 1500 nm.

Preferably, the article comprises a layer of Yttrium Stabilized Zirconium (YSZ) between the sapphire substrate and the superconductive layer.

Preferably, the article comprises a template layer of YBCO between the superconductive layer and the YSZ layer. The template layer optionally has a c lattice parameter of at least 1.175 nm.

In an exemplary embodiment, the article comprises a sapphire substrate; an YSZ layer on a surface of the substrate, and two or more bi-layers one on top of the other, each bi-layer comprising a first YBCO layer having a c lattice parameter of at least 1.175 nm and a second YBCO layer having a c lattice parameter of between 1.1169 and 1.171 nm.

There is also provided in accordance with an exemplary embodiment of the invention a method of making a superconductive layer, the method comprising:

(a) providing an r-cut sapphire substrate having a surface covered with an YSZ layer;

(b) depositing YBCO onto the YSZ layer so as to form a template layer having a c lattice parameter of at least 1.175 nm; and (c) depositing YBCO onto the template layer so as to form an YBCO layer having a c lattice parameter of between 1.1169 and 1.171 nm.

8. A method according to claim 7, comprising:

(c) depositing YBCO onto a superconductive YBCO layer so as to form a template layer having a c lattice parameter of at least 1.175 nm on the superconductive YBCO layer; and (d) depositing YBCO onto the layer formed in (c), to form a superconductive YBCO layer.

Optionally, actions (c) and (d) are repeated more than once.

In some embodiments, depositing YBCO to form a YBCO layer having a c lattice parameter of at least 1.175 nm comprises sputtering YBCO under a first partial pressure of oxygen; and depositing YBCO so as to form an YBCO layer having a c lattice parameter of 1.169 nm comprises sputtering YBCO under a second partial pressure of oxygen.

Optionally, the first partial pressure of oxygen is between 10% and 20%. Alternatively or additionally, the second partial pressure of oxygen is greater than 45%.

Optionally, sputtering comprises intermittent sputtering.

In some embodiments, the method comprises stopping the deposition of YBCO on a template layer when the thickness of the layer being deposited is between 10 nm and 50 nm. In some embodiment, the method comprises stopping the deposition of YBCO on a template layer when the thickness of the layer being deposited is 600 nm or more.

In an exemplary embodiment, providing an r-cut sapphire substrate having a surface covered with an YSZ layer comprises:

providing an r-cut sapphire substrate; and sputtering on the r-cut sapphire substrate SYZ under an atmosphere consisting essentially of oxygen.

Optionally, in the latter embodiment, sputtering is at a substrate temperature of between 905 and 915° C.

Optionally, the method comprises radiating the substrate so as to heat it to said substrate temperature.

Optionally, the method comprises cooling the substrate with the YSZ layer to room temperature. Alternatively or additionally, the method comprises exposing the substrate with the YSZ layer to ambient air.

There is also provided in accordance with an exemplary embodiment of the invention a sapphire substrate covered with an YSZ layer obtained in a method comprising:

providing an r-cut sapphire substrate; and sputtering on the r-cut sapphire substrate SYZ under an atmosphere consisting essentially of oxygen.

Optionally, the method comprises sputtering at a substrate temperature of between 890 and 930° C.

Optionally, the method comprises radiating the substrate so as to heat it to said temperature.

There is also provided in accordance with an exemplary embodiment of the invention a sapphire substrate exposed to ambient environment, the substrate having at least one face covered with a layer of YSZ.

In some embodiments, the ambient environment comprises an atmospheric pressure of air. Optionally, the air is between −40° C. and 45° C.

There is also provided in accordance with an exemplary embodiment, a method of making an YSZ layer on a sapphire substrate, the method comprising:

heating the substrate to a substrate temperature above 680° C., optionally between 890° C. and 930° C.; and sputtering YSZ onto the heated substrate under an atmosphere consisting essentially of oxygen.

Optionally, the sputtering is at pressure of between 4 and 6 mTorr.

In some embodiments, the method comprises cooling the substrate with the YSZ layer to room temperature. Additionally or alternatively, the method comprises exposing the substrate with the YSZ layer to ambient air.

There is also provided in accordance with an embodiment of the invention an article comprising an r-cut sapphire substrate carrying a superconductive layer of a compound of the formula $YBa_2Cu_3O_{7-x}$ (YBCO), the layer having thickness of between 10 nm and 50 nm, and critical current of at least 10 A/cm at a temperature higher than 77K.

Optionally, the articles has surface area of 10 $cm^2$ or more, optionally, 100 $cm^2$ or less.

In some embodiments, the article is exposed to ambient conditions.

Preferably, the article comprises a layer of Yttrium Stabilized Zirconium (YSZ) between the sapphire substrate and the superconductive layer.

Preferably, the article comprises a template layer of YBCO between the superconductive layer and the YSZ layer. The template layer optionally a c lattice parameter of at least 1.175 nm.

There is also provided in accordance with an exemplary embodiment an article comprising a sapphire substrate carrying a superconductive layer of a compound of the formula $YBa_2Cu_3O_{7-x}$ (YBCO) and a layer of Yttrium Stabilized Zirconium (YSZ) between the sapphire substrate and the superconductive layer, the superconductive layer having surface area of at least 10 cm$^2$, and critical current of at least 100 A/cm width at a temperature of 77K or higher. Optionally, the superconductive layer has surface area of up to 100 cm$^2$.

Optionally, the article comprises a template layer of YBCO between the superconductive layer and the YSZ layer, and the template layer optionally has a c lattice parameter of at least 1.175 nm.

In some embodiment, the article comprises a sapphire substrate; an YSZ layer on a surface of the substrate, and two or more bi-layers one on top of the other, each bi-layer comprising a first YBCO layer having a c lattice parameter of at least 1.175 nm and a second YBCO layer having a c lattice parameter in the range of 1.169-1.171 nm.

In accordance with an exemplary embodiment, there is provided an electrical circuitry comprising a power consumer connectable to a power source through a conductor, wherein the conductor comprises an article according to any of the above-described embodiments.

Optionally, such electrical circuitry further comprises a temperature control, which controls the temperature of the article to be at a temperature at which the superconductive layer is superconductive.

In an exemplary embodiment of the invention there is provided an article comprising:

an r-cut sapphire substrate;
a YSZ layer on the substrate;
a first layer of a compound of the formula $YBa_2Cu_3O_{7-x}$ (YBCO), on the YSZ layer; and
a second layer of YBCO on the first YBCO layer,
wherein the first layer of YBCO has a c lattice parameter of at least 1.175 nm, and the second layer of YBCO has a c lattice parameter of between 1.1169 and 1.171 nm.

Optionally, the said second layer of YBCO has surface area between 10 cm$^2$ and 100 cm$^2$.

Optionally, the second layer of YBCO has surface area of 100 cm$^2$ or less.

In some embodiments, the second layer of YBCO has thickness of between 10 nm and 50 nm.

In some embodiments, the second layer of YBCO has thickness of between 600 nm and 1500 nm.

In a preferred embodiment, the articles comprises a sapphire substrate; an YSZ layer on a surface of the substrate, and two or more bi-layers one on top of the other, each bi-layer comprising a first YBCO layer having a c lattice parameter of at least 1.175 nm and a second YBCO layer having a c lattice parameter of between 1.1169 and 1.171 nm.

In any of the above embodiments, the substrate is optionally an r-cut sapphire wire.

BRIEF DESCRIPTION OF THE DRAWINGS

In order to understand the invention and to see how it may be carried out in practice, embodiments will now be described, by way of non-limiting example only, with reference to the accompanying drawings, in which.

DETAILED DESCRIPTION OF EMBODIMENTS

The present invention relates, in some embodiments thereof, to a sapphire substrate having on it an YSZ buffer layer. In some embodiments, the substrate also has a superconductive YBCO layer.

Exemplary Superconductive Layer

An aspect of some embodiments of the invention concerns an article comprising a substrate with a superconductive layer grown thereon.

Figures 1A, 1B:
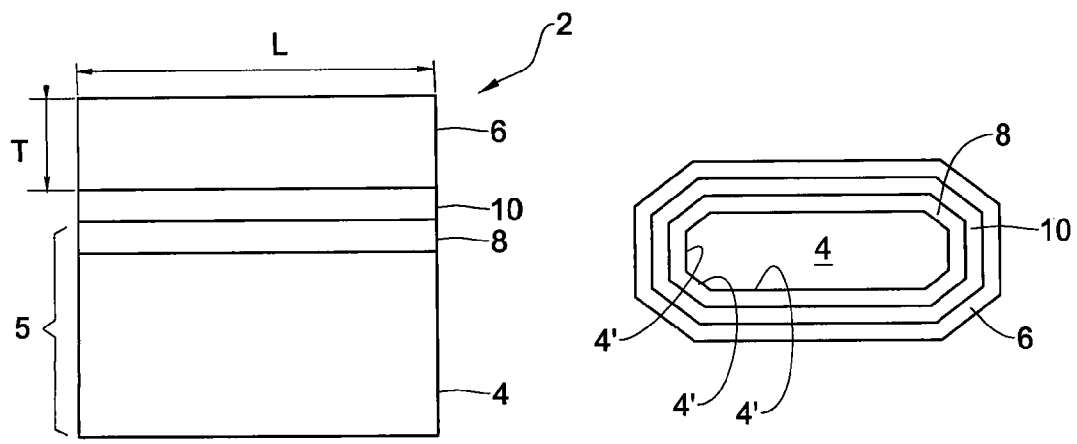
FIG. 1A is a schematic illustration of an article according to an exemplary embodiment of the invention.
FIG. 1B is a schematic illustration of a cross-section in a wire-shaped article according to an exemplary embodiment of the invention.

FIG. 1A is a schematic illustration of an article (2) according to an exemplary embodiment of the invention.

Composition 2 is shown to include a sapphire substrate (4) carrying a superconductive layer (6) of a compound of the formula $YBa_2Cu_3O_{7-x}$ (YBCO). Composition 2 also has a layer (8) of Yttrium Supported Zirconium (YSZ) between sapphire substrate 4 and superconductive layer 6, and a layer (10) of non-superconductive YBCO between the superconductive layer and the YSZ layer.

The substrate and the protective layer together are marked as 5, and may be prepared in situ or separately, as discussed below.

Layer 6 has a length L and thickness T. The layer also has width W, not shown, as it lies on a plane perpendicular to the plane of the drawing.

FIG. 1B is a schematic illustration of a cross-section in an article similar to that illustrated in FIG. 1A, except for the substrate (4) being an r-cut sapphire wire. The wire has six faces 4', each being, for example, a [1012] plane, and is obtainable in accordance with the method described in Ref. 14.

Dimensions of the Different Layers

In some embodiments, the surface area of the superconductive layer is between about 10 and about 100 $cm^2$.

In some embodiments, a lateral size L of the superconductive layer 6 is 2.5 cm or more. Some exemplary sizes are 2.5 cm, 5 cm, 8 cm, and 10 cm.

Similarly, in some embodiments of the invention, width W of superconductive layer 6 is 2.5 cm or more. Some exemplary sizes are 2.5 cm, 5 cm, 8 cm, and 10 cm.

In some exemplary embodiments of the invention conductive layer 6 is disk-shaped, having equal length and width.

It is sometimes convenient to prepare a disk-shaped superconductive layer 6, and then cut it (with the underlying layers) to have other shapes, as may be required for further processing or use.

In different embodiments of the invention, thickness T of layer 2 varies between about 10 nm to about 1500 nm. Of particular interest are very thin layers, wherein T is between 10 nm and 50 nm, and relatively thick layers, wherein T is 600 nm or greater. Some properties and uses of very thin layers and relatively thick layers are described below.

The thickness of buffer layer 8 is optionally between about 80 nm and about 110 nm. Buffer layer 8 covers an entire surface of substrate 4, or a portion thereof.

The thickness of template layer 10 is optionally between about 20 nm and about 30 nm. Template layer 10 covers the entire surface of buffer layer 8, or a portion thereof.

Superconductive layer 6 covers the entire surface of template layer 10 or a portion thereof Exemplary Method of Making a Superconductive Layer An aspect of some embodiments of the invention concerns a method of making a superconductive layer on a substrate.

Figure 2:
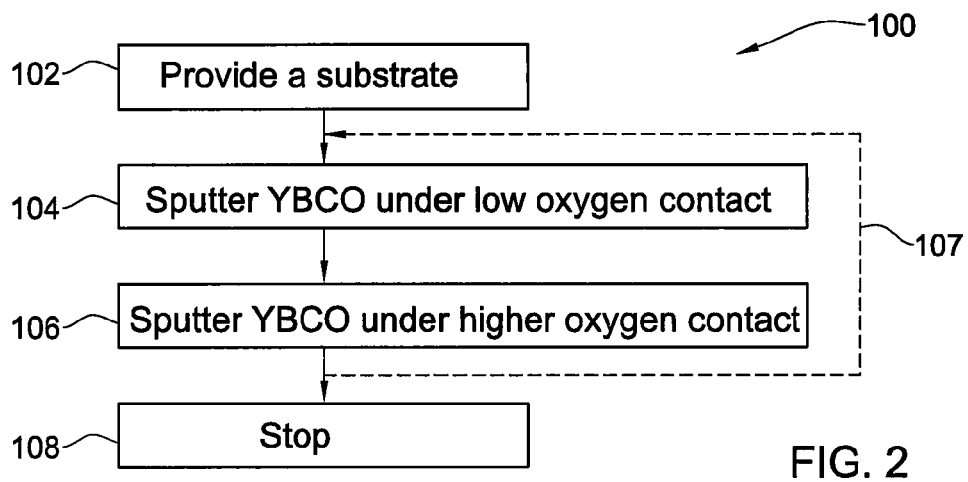
FIG. 2 is a flowchart of actions taken in a method 100 of making a superconductive layer according to a preferred embodiment of the invention.

FIG. 2 is a flowchart of actions taken in a method 100 of making a superconductive layer according to a preferred embodiment of the invention. Optionally, the superconductive layer is layer 6 of FIG. 1.

At 102, a sapphire substrate is provided. The substrate preferably has an (1012) plane covered with an YSZ layer (see part 5 of FIG. 1). In some embodiments, the YSZ protected sapphire is provided as a single unit, prepared in advance, and optionally kept at ambient environment. In some other embodiments, the YSZ protected sapphire is provided by in situ preparation. Protecting the sapphire with an YSZ layer according to an exemplary embodiment of the invention is described below under the heading "exemplary making of an YSZ layer".

At 104, YBCO is sputtered from an YBCO target. Optionally, the YBCO target is superconductive.

Optionally, YBCO sputtering comprises off axis dc magnetron sputtering from an YBCO ($YBa_2Cu_3O_{7-x}$) stoichiometric target with x between 0.05 and 0.30. Exemplary sputtering conditions are furnace temperature corresponding to substrate temperature of between about 650° C. and about 680° C., under pressure of between about 40 and about 50 mTorr of a gas mixture, optionally comprising less than 30% oxygen, for example 15-20% oxygen. The rest of the gas mixture is optionally an inert gas or gas mixture, for instance, argon.

An exemplary setup for measuring the temperature of the substrate is described below under the heading "Exemplary temperature measurements".

Exemplary value of dc power on the target is 80-140 W. Dc power of 140 W was found to yield a sputtering rate of about 0.03 nm/sec. An annealing process in pure oxygen is optionally performed, optionally for about 16 hours at approximately 500° C.

The sputtering at action 104 is designed to form a layer having a structure that is intermediate between that of the underlying YSZ layer and that of the layer that will be sputtered on it in action 106 discussed below.

At 106, similarly to 104, YBCO is sputtered from an YBCO target; but here, the partial pressure of oxygen in the gas mixture is higher, to ensure superconductivity of the resultant layer. Optionally, the partial pressure of oxygen is more than 45%, for example, 55-60%. Optionally, the pressure is also higher, for example, 75-85 mTorr.

In an exemplary embodiment, the partial pressure of oxygen in the atmosphere under which YBCO is sputtered in action 106 is increased by adding oxygen to the atmosphere, thus raising both the partial pressure of oxygen and the overall pressure.

In some embodiments, when the oxygen is added sputtering is stopped, so as to sputter the YBCO under two distinct conditions: lower oxygen pressure and higher oxygen pressure.

In some embodiments, oxygen is added while sputtering continues. For instance, in some embodiments, the oxygen is added such that the pressure is fully raised within 5 minutes, leading to working for these 5 minutes under intermediate and gradually increasing oxygen contents. In some cases, sputtering under gradually increasing oxygen content results in the formation of a layer of intermediate and progressing oxygen content.

Optionally, sputtering at action 106 is intermittent. In some embodiments it was shown that sputtering for two hours, and then shutting down the power of the sputtering gun for two hours, and then turning it on again results in more ordered superconductive layers. Without being bound to theory, it may be suggested that some reordering takes place during the intermission time.

Optionally, sputtering action 106 is followed by annealing.

At 108, growth of the superconductive layer is stopped. Stopping the layer growth optionally comprises stopping the sputtering, cooling the layer, for example, to room temperature, and/or exposing the layer to ambient atmosphere, which typically comprises air, optionally with water vapor, and may also comprise other components.

In some embodiments, the growth is stopped when the superconductive layer is between about 10 and about 50 nm. If the sputtering rate is 0.03 nm/sec, this means stopping action 106 after between about 5 and about 25 minutes.

In some embodiments, the growth is stopped when the superconductive layer is 600 nm thick or more.

Stopping the growth after a layer of intermediate growth of between 50 and 600 nm of the superconductive layer is also within the scope of some embodiments.

Optionally, before the process is stopped, actions 104 and 106 are repeated any desirable number of time, for instance, 1, 2, 3, or 10 times (see arrow 107). In such a case, the obtained substrate has on it a plurality of superconductive UBCO layers intercalated by non-superconductive YBCO template layers.

Exemplary Making of YSZ Layer

An aspect of some embodiments of the invention concerns growing YSZ on sapphire.

Figure 3:
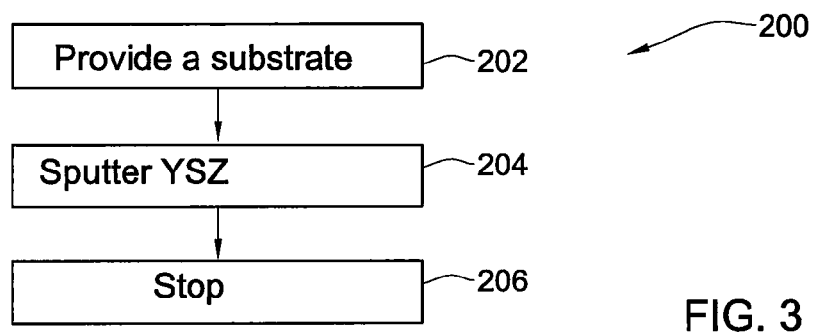
FIG. 3 is a flowchart of actions taken in a method of growing YSZ on sapphire according to an embodiment of the invention.

FIG. 3 is a flowchart of actions taken in a method 200 of growing YSZ on sapphire according to an embodiment of the invention.

Method 200 is optionally used for providing the YSZ-protected substrate in a method as described in FIG. 2.

At 202, a sapphire substrate is provided, optionally after standard cleaning, for example, with acetone and ethanol, as well known in the art. The sapphire usually used by the inventor is r-cut sapphire wafer manufactured by ALMAZ optics, USA. Optionally, the sapphire is an r-cut sapphire wire, as described in Ref. 14.

At 204, YSZ is deposited, on the provided substrate, by sputtering, pulsed laser deposition (PLD), and/or any other available technique. Optionally, the YSZ layer is grown by off axis dc magnetron sputtering from a stoichiometric single target. Optionally, the target comprises 95% $Y_2O_3$ and about 5% $ZrO_2$. The YSZ layer is sputtered at about 4-6, for example, 5 mTorr of oxygen with the substrate at about 905 to about 915° C.

At 206 growing the YSZ is stopped.

In some embodiments, stopping the growth comprises cooling only to about 700° C., and in situ further processing the YSZ-protected sapphire, for instance, in a method as described in FIG. 2 above.

In some embodiments, stopping the growth comprises cooling to room temperature and/or exposing to ambient atmosphere. Room temperature is usually between −40 and 45° C., for example, between 20 and 25° C.

Exemplary Heating Apparatus

In some embodiments, a substrate is heated to temperatures of between about 680° C. and about 915° C. It is preferable that the temperature of the substrate is uniform, for example, it is usually preferred that a disk-shaped substrate of 7.5 cm in diameter will be entirely at the same temperature, with deviations of no more than 5° C. from one point to another.

Figure 4A:
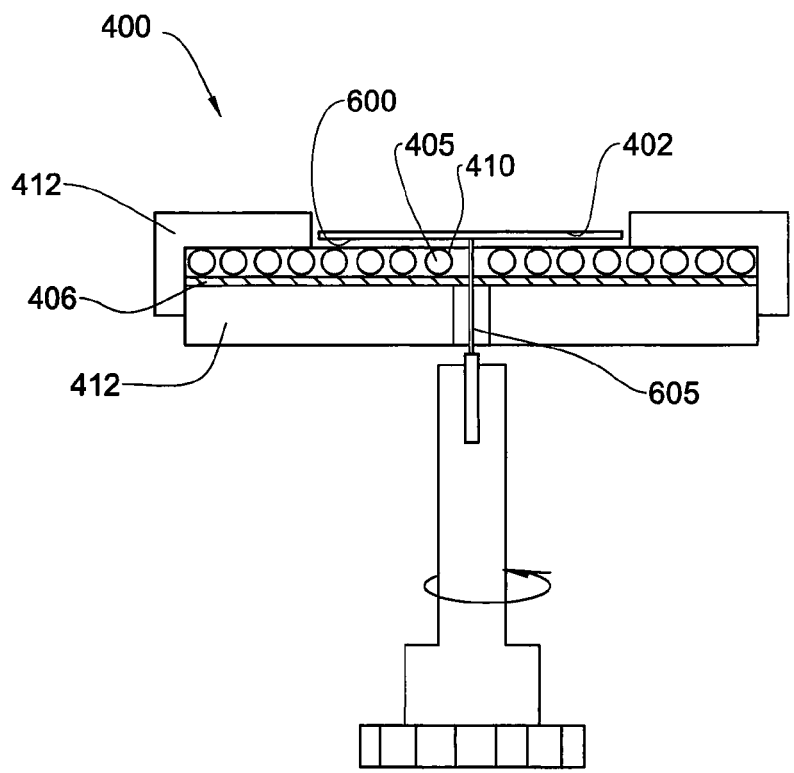
FIGS. 4A and 4B are schematic illustrations of a side view and an upper view of an open furnace suitable for heating a substrate according to some embodiments of the invention.
Figure 4B:
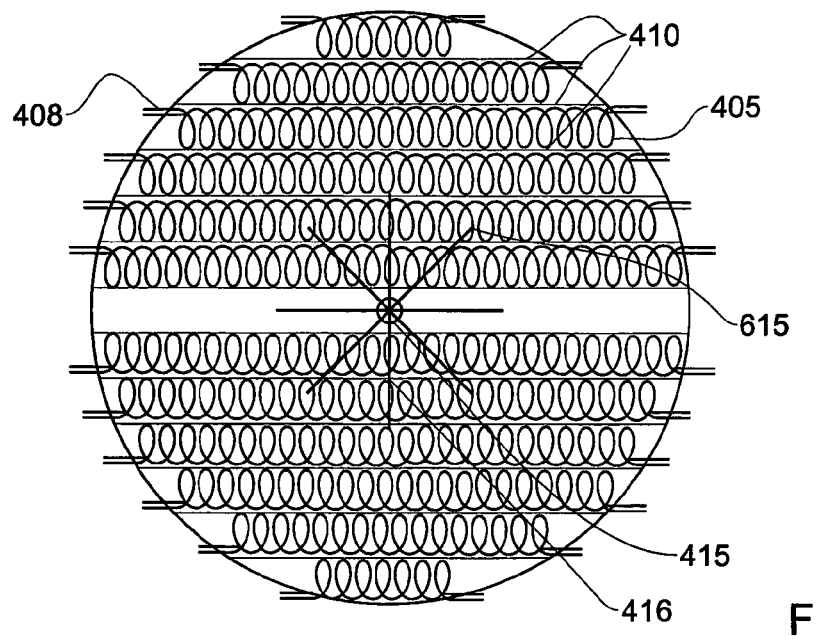

To achieve such accurate temperature distribution over large areas of between about 10 and about 100 cm², for example, about 44 cm², the inventors developed a special furnace FIGS. 4A and 4B are schematic illustration of a side view and upper view, respectively, of a furnace 400 suitable for heating a substrate according to some embodiments of the invention.

In furnace 400, a substrate 402 (not shown in FIG. 4B, in order not to hide the heating wires) is heated by radiation from heated wires (405) placed inside tubes (410). Wires 405 are optionally commercial resistance wires, for example, RW155 from AircraftmaterialsUK.com, which can stand temperatures as high as 1400° C. Optionally, the wires are all electrically connected to each other so as to form a single electrical resistor. Tubes 410 protect substrate 402 from materials released from wires 405 when the wires are heated, without interfering with the heating provided by the wires. Preferably, tubes 410 are made of quartz, which is transparent to IR radiation. Optionally, surface 406 below wires 405 (not shown in FIG. 4B) is reflective, so as to reflect heating radiation approaching the surface from the wires, and directing them to the sample.

Optionally, wires 405 are wound into spiral helixes, and the packing density of each of the wires is controlled independently of the other to achieve best temperature homogeneity. Optionally, the packing density is controlled with screws (408) attached to the ends of each of wires 405, such that scrolling the screw changes the packing density. Optionally, the packing densities of each of the various wires 405 are controlled to homogeneously heat a substrate. This is optionally done in a trial and error process. Optionally, the temperatures at different portions of the furnace are evaluated by color of the black body radiation emitted from the wires. This control of packing density, also referred herein as calibration of the furnace, is optionally done once for the entire lifetime of the furnace. Optionally, a finer calibration is carried out with the temperature being measured with a thermocouple, as described below under the heading of "exemplary temperature measurement".

Optionally, the number of turns in each tube is carefully adjusted in advance to provide a good starting point for the above-described trial and error process.

Optionally, body 412 of furnace 400 is made of alumina or other suitable material of high heat resistance and low thermal conductivity.

Figure 6:
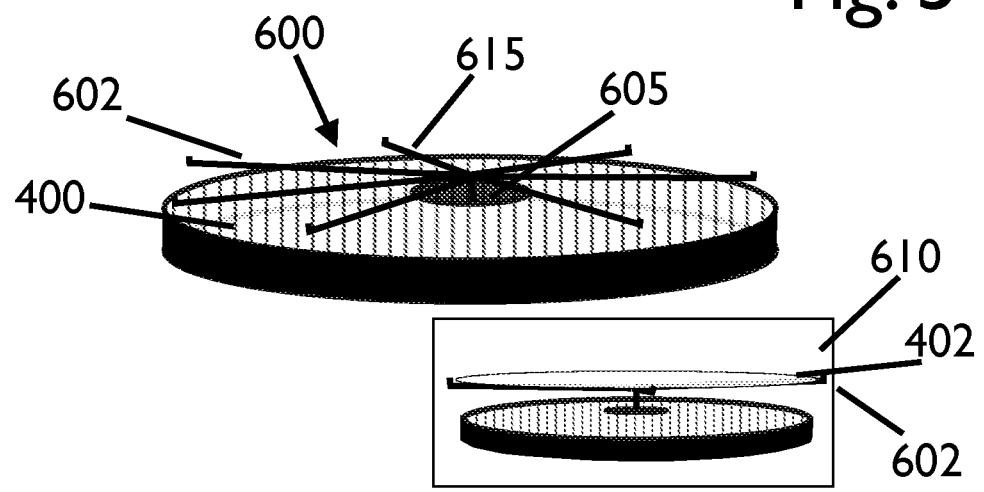
FIG. 6 is a photograph of a sample holder suitable for holding a sample during processing according to some embodiments of the invention.

At the center of furnace 400 there is shown an aperture 415 (FIG. 4B), for attaching to the furnace a sample holder 600, photographed in FIG. 6.

Figure 5:
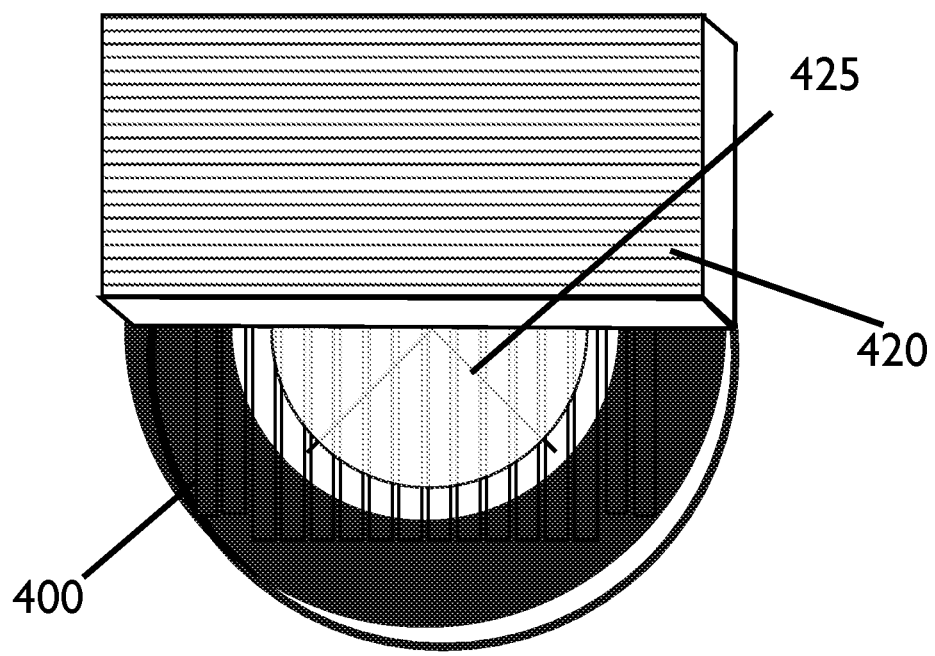
FIG. 5 is a photograph of a half-open furnace suitable for heating a substrate according to some embodiments of the invention.

To achieve higher temperatures, for example, as high as required in YSZ growth according to some embodiments, an additional heating element 420 is placed on top of the wafer (425), as shown in FIG. 5. Heating element 420 is optionally another furnace of the kind described in FIGS. 4A and 4B. Heating element 420 is placed above furnace 400 so as to cover wafer 425 wholly or partially. During sputtering, partial coverage is preferred.

In operation, wafer 402 is rotated on holder 600 with the center above aperture 415. When an upper heating element 420 is used, part of the wafer is between furnace 400 and heating element 420, and the rest of the wafer is heated only by furnace 400. Optionally, sample holder 600 rotates so as to constantly change the wafer portions that are heated by the heating element. The portions not covered by the heating element are optionally free to receive scattered molecules for forming a layer on the uncovered wafer portions.

An exemplary sample holder 600 is photographed in FIG. 6. The shown wafer holder is rotatable to allow better temperature homogeneity during heating. The holder (600) includes a quartz pin 605, which is short enough to allow close proximity of sample (402) to heating elements (405, 410) of the furnace 400 when the pin is inserted in aperture 415. In this context, a distance between about 1 and 4 mm is considered "close proximity". Holding the sample in close proximity to the furnace, allows minimizing heat loss, and with it, minimizing the heating power. The pin material, which preferably is quartz, holder diameter, which is optionally only slightly larger than the size of the wafer held thereby, holder design, which is optionally between 6 and 8 equally spaced thin quartz legs, and length, designed to hold the wafer in proximity of the furnace, cooperate in reducing heat loss from the center of the wafer, and improving the uniformity of the temperature distribution in the sample. The holder optionally has several (for example, 4 to 8) legs 615 attached to quartz pin 605 and adapted to receive thereon the sample. Optionally, legs 615 have curved ends (620) for preventing the sample from slipping from the holder.

Exemplary Temperature Measurements

Figure 7:
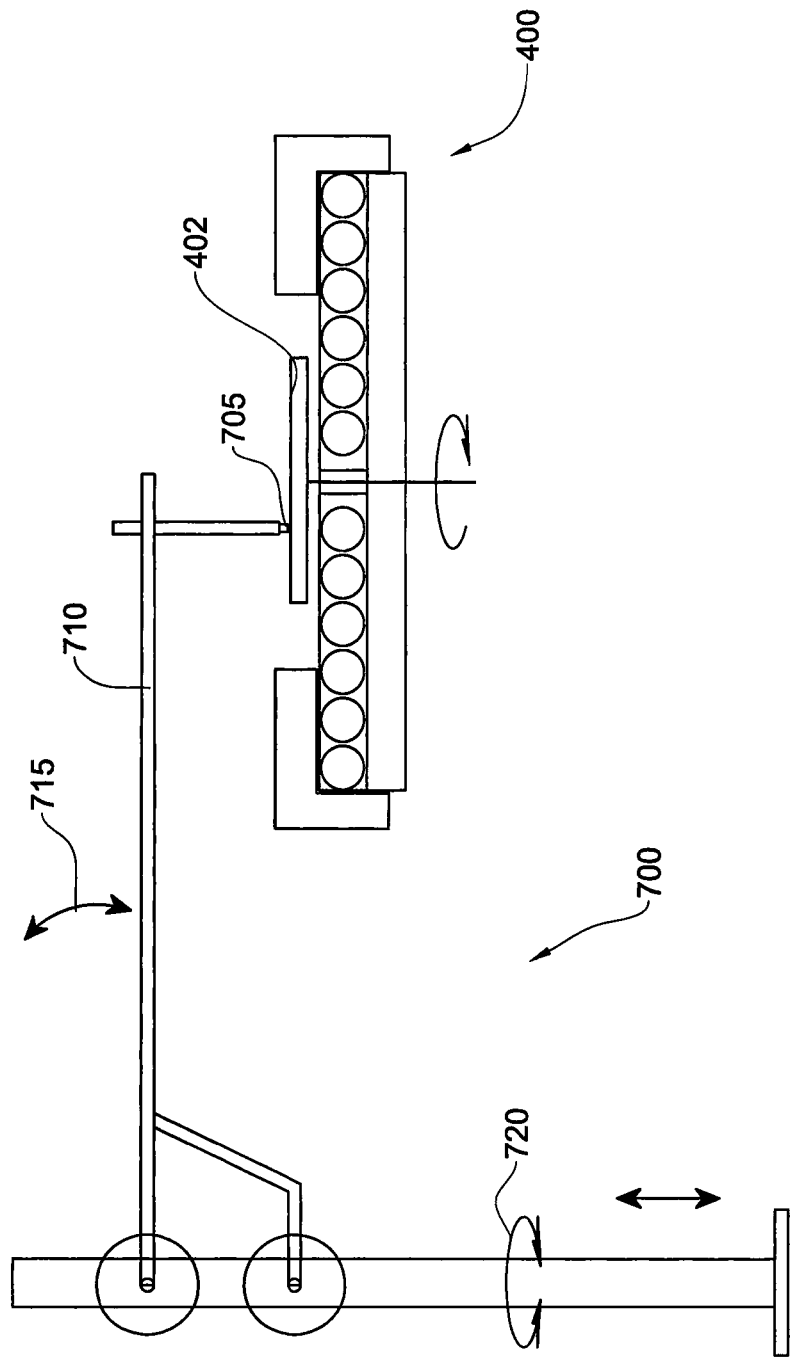
FIG. 7 is a schematic illustration of a temperature measuring apparatus according to an embodiment of the invention.

In some embodiments of the invention, the temperature of the substrate is accurately measured at least before the beginning of the growth. FIG. 7 is a schematic illustration of a device 700 for measuring temperature of a sample 402 heated with a furnace 400. Optionally, system 700 comprises a thermocouple 705, placed on the surface of substrate 402. The accuracy of the measurement is optionally to ±0.5° C.

However, during sputtering it is very difficult to measure the temperature accurately, since it is practically impossible to place a thermocouple on the rotating sample during heating. Optionally, during sputtering, a thermocouple that measures the furnace temperature (rather than the sample temperature) is used. The temperature difference between the furnace and the sample before sputtering is assumed to be the same during sputtering, and therefore, furnace temperature is indicative of the sample temperature.

The temperatures recited in the present description and claims were measured with a device similar to device 700, configured to measure the temperature of wafer 402 before the beginning of the growth. A thermocouple 705 was connected at one end of one arm 710 of a lever which is free moveable upwards and downwards (see arrow 715), similar to a Hi-Fi pick-up arm. Still similar to a Hi-Fi pick-up arm, arm 710 is also rotatable (see arrow 720) so as to be deliverable to different parts of the wafer. When thermocouple 705 is lowered, the weight of the lever's arm and thermocouple assures contact of the thermocouple with the substrate surface with minimal pressure to the surface. Preferably, the pressure is small enough not to bend the holder and not to change the distance between any portion of the sample and the furnace. Optionally, the thermocouple is controllable to contact the sample at different distances from the center, thus allowing temperature reading at different points, which is particularly useful during furnace calibration. Optionally, substrate temperature is measured at the beginning of each growth process, compared to the furnace temperature, and from this point on, the growth temperature is evaluated by the furnace temperature and the difference between it and the sample temperature as measured before growth began.

Experimental Results

Critical Current

Figure 8A:
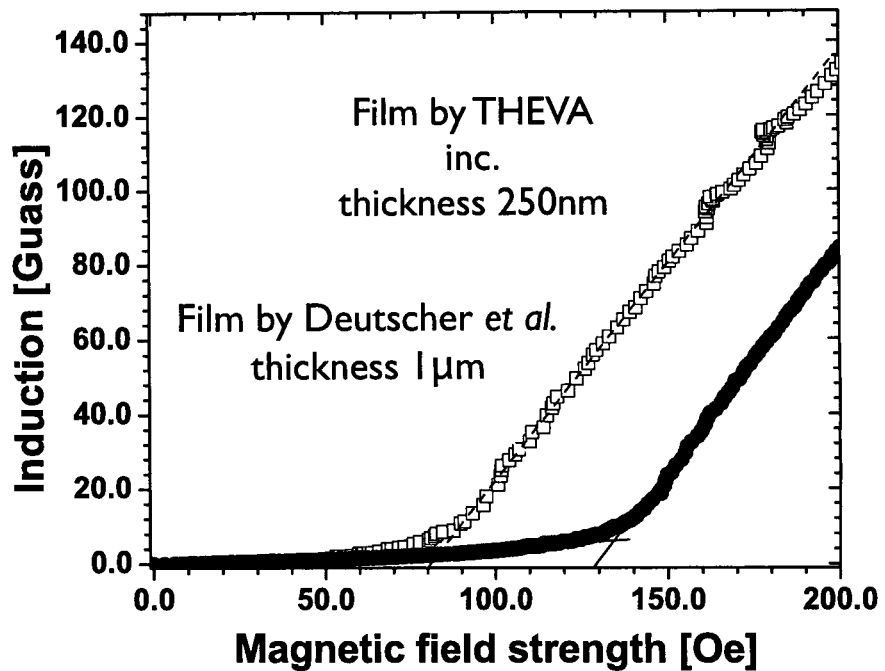
FIG. 8A is a graph showing results of magnetic penetration measurements made with a 1000 nm thick superconductive layer according to an embodiment of the invention (squares) and of a 250 nm layer commercially available from THEVA.
Figure 8B:
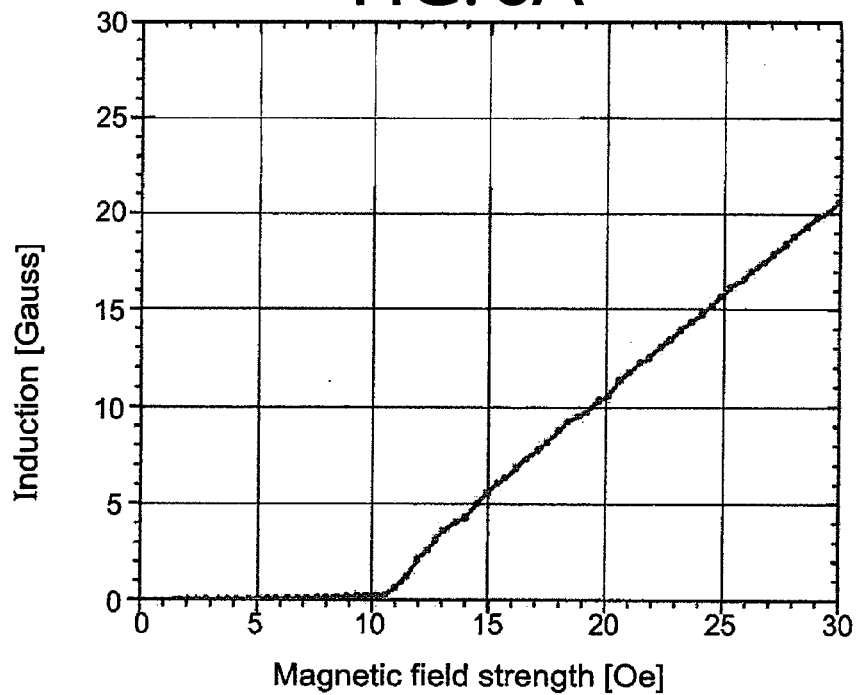
FIG. 8B is a graph showing results of magnetic penetration measurements made with a 40 nm thick superconductive layer according to an embodiment of the invention.

FIGS. 8A and 8B show the variations of the induction field measured at the center of a 3" YBCO film as a function of the external magnetic field applied perpendicular to the wafer. The curves show break points, at which increasing the magnetic field dramatically increases the induction. Following reference 13, the magnetic field value at this point is defined as the penetration field. The graphs of FIG. 8A show the penetration field of a 1000 nm thick superconductive layer according to an embodiment of the invention and of a 250 nm layer commercially available from THEVA Dünnschichttechnik GmbH, Germany (K Develos et. Al.) The graph of FIG. 8B shows the penetration field of a 40 nm thick superconductive layer according to an embodiment of the invention. The thickness was evaluated from a SEM image (not shown).

The penetration fields are shown to be 83 Oe for the 250 nm layer of THEVA, 134Oe for the 1000 nm layer and 11 Oe for the 40 nm layer.

The penetration field is proportional to the critical current per unit width. Thus, FIG. 8A shows that the layer according to the embodiment of the invention is 4 times thicker and has a critical current per cm width that is about 50% greater than that of the commercially available product.

Figure 9:
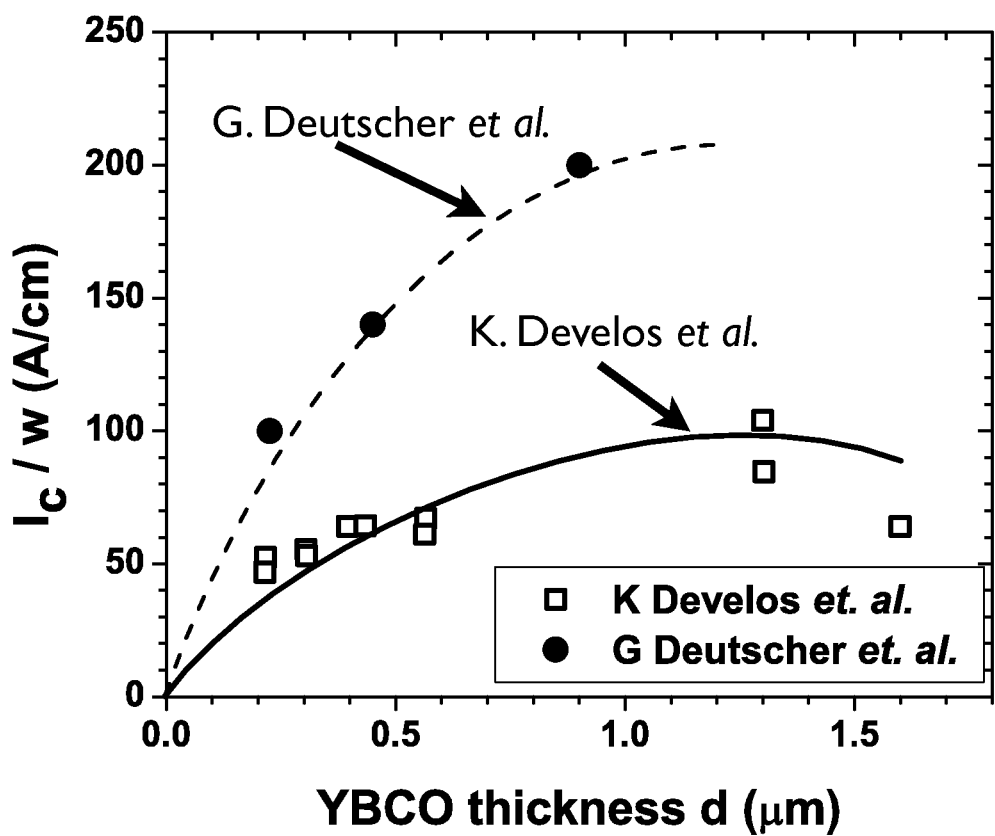
FIG. 9 is a graph showing critical currents of superconductive layers of different thicknesses obtained according to some embodiments compared with results reported in ref. 9 (K. Develos et al.)

FIG. 9 shows the critical current per unit width for different film thicknesses obtained according to some embodiments and reported by Develos et al. The lines are provided for guiding the eye.

Exemplary Template Layer

Figure 10:
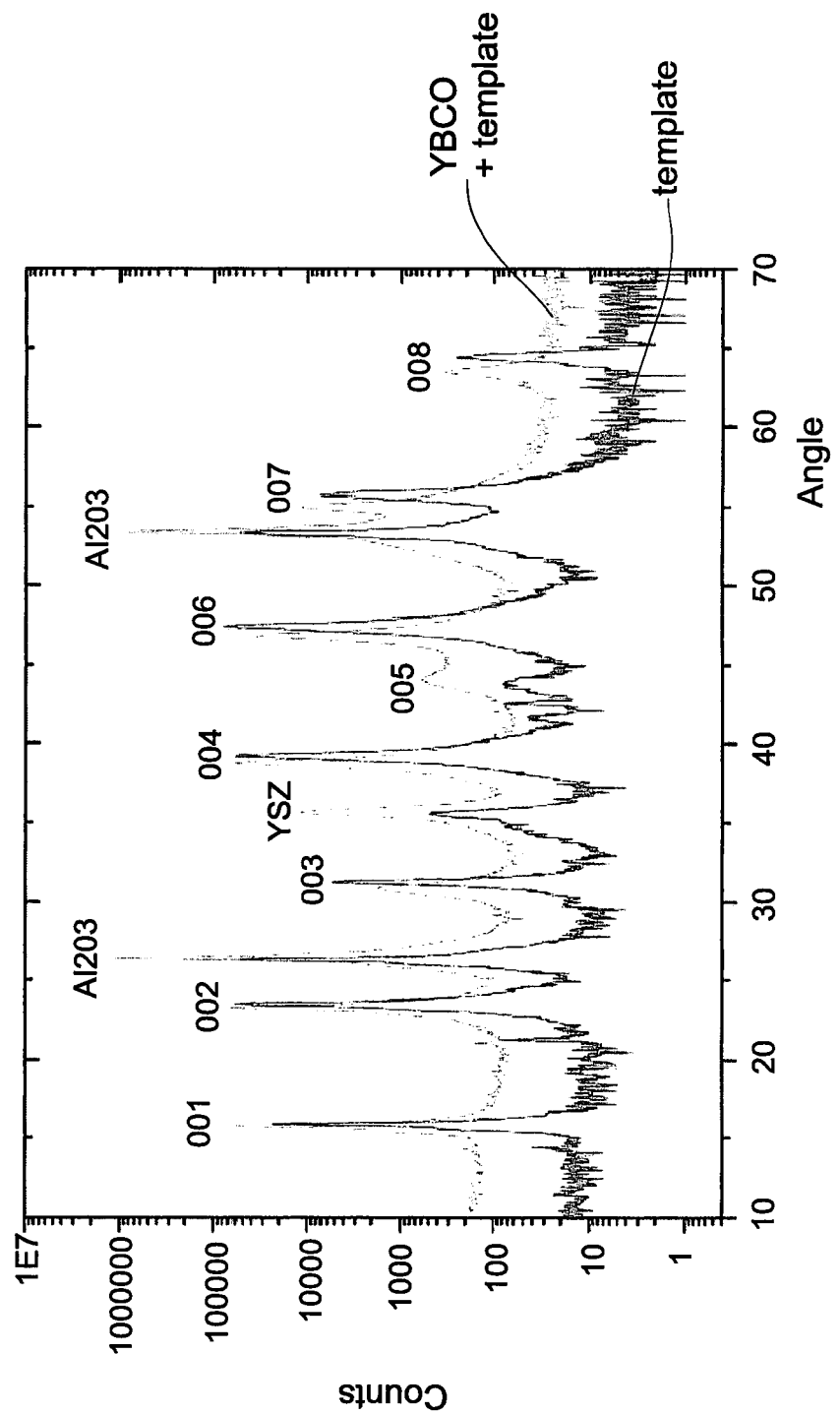
FIG. 10 is an X-Ray diffraction spectrum of a template layer and of an YBCO layer on top of the template (green), according to some embodiments of the invention.

FIG. 10 is an X-Ray diffraction spectrum of a template layer alone and a superconductive YBCO layer on top of the template. The observed shifts in the peaks numbered from 001 to 008 are associated with a difference in the lattice parameter between the layers. The peaks were analyzed to show that the template layer alone has a c-parameter of 1.179, which corresponds to x value of 0.85, at which YBCO is known to be not superconductive.

Exemplary Coated Sapphire Wire

In some embodiments, the substrate is an r-cut sapphire fiber, tape, or ribbon, obtainable as described in US Patent Application Publication No. 2009-0081456 to Goyal, incorporated herein by reference in its entirety (hereinafter Goyal). Such substrates are referred herein generally as sapphire wires.

Exemplary dimensions of sapphire wire substrate are as described by Goyal, for example: length larger than width by factor of at least 10, length of between 1 m and 1000 m, thickness of between 50 and 400 micrometers and width of between 100 micrometers and 25 cm.

In some embodiments, for example, when the wire is short and/or flexible enough to be placed on a disk having a surface area of about 100 $cm^2$, the wire may be coated with YSZ and YBCO using the above-described systems.

In some embodiments, for example, when the wire is too long and/or not flexible enough to be treated in the above-describe system, an alternative coating system may be applied.

In one embodiment, a system for coating a long wire will include two spoolers, one for feeding in pristine wire, and one for collecting coated wire. A wire stretched between the two spoolers will go through a heating unit having heaters spaced along the wire, optionally perpendicularly to the wire. In an exemplary embodiment, heaters will be placed at both sides of the wires.

Along the wire there will be at least one sputtering station, comprising a target, for example YBCO target or YSZ target, connected to a voltage source.

In some embodiments, the sputtering station will be free of heaters, to allow sputtered material reaching the wire. Optionally, the target is at one side of the wire, and the other side includes heaters.

The region between the two spoolers, and optionally the spoolers themselves, will be kept under atmosphere suitable for sputtering from the target, as described above.

The heaters will heat the wire to the suitable temperatures, as described above.

The collecting spooler will rotate to collect wire from the feed-in spooler, to move the wire through the sputtering station(s). The rotation will optionally be continuous. In some embodiments, the rotation will be adapted for ensuring a constant rate of linear motion between the two spoolers. This will require slower rotations in later stages of the coating process, when the spooler collected wire and gained a larger effective diameter.

Figure 13A:
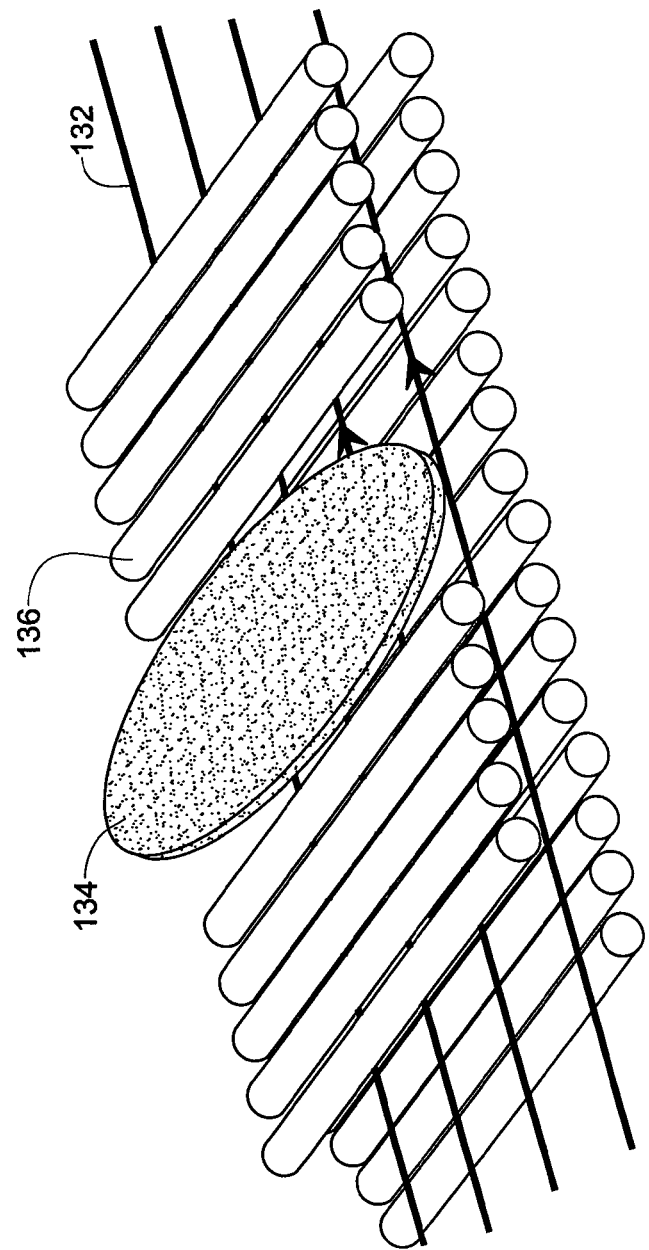
FIG. 13A is a schematically illustrated perspective view of sapphire wires when being coated according to an embodiment of the invention.

FIG. 13A is a schematically illustrated perspective view of sapphire wires 132 when being coated with YSZ or YBCO according to one possible embodiment. Four wires are shown in the figure, but similar embodiments with other numbers of wires, for example, between 1 and 10, are also possible. The figure shows a target 134, which upon being exposed to external voltage (for example, DC or RF) sputters particles of the target onto wires 132. Sputtering from target 134 may be in-axis as shown in the figure, or off-axis, with the targets lying in a plane perpendicular to the wires. The distance between the target and the wires (in the in-axis configuration) will optionally be 1 cm or larger, preferably not larger than the target diameter.

The figure further shows heaters 136, which are optionally quartz tubes with resistive spiral wires, the densities of which may be varied to adjust the temperature homogeneity, as discussed above.

Figure 13B:
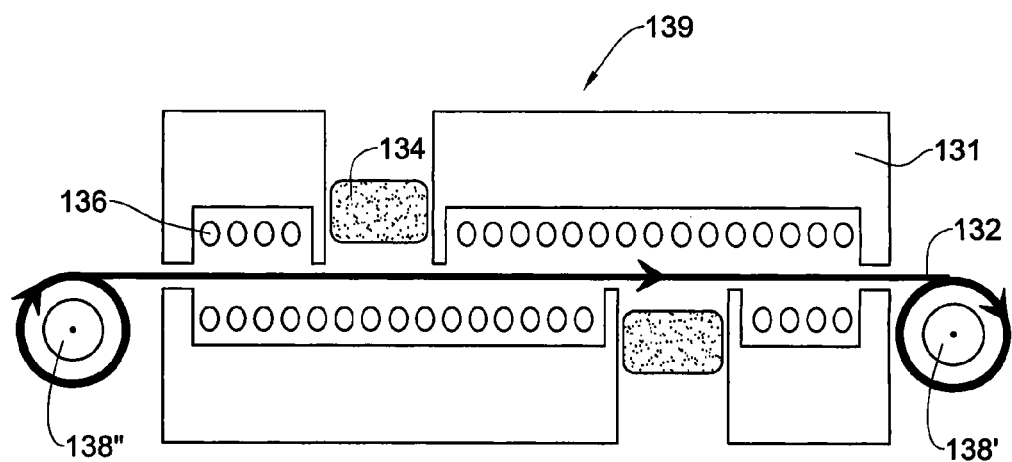
FIG. 13B is a schematically illustrated side view of a system for coating sapphire wires according to an exemplary embodiment.

FIG. 13B is a schematically illustrated side view of a system 139 for coating sapphire wires according to an exemplary embodiment. The figure shows furnace body 137, in which heaters 136 reside. Furnace body 137 preferably has low thermal conductivity and high electric resistance. Optionally, body 137 is made of alumina. FIG. 13B shows a system where the wires are coated from two sides, but other embodiments allow growing the layer from one side only.

FIG. 13B shows only one target at each side of the wire. In other embodiments, more targets are used along the wires. Generally, increasing the number of targets facilitates obtaining thicker layers in shorter deposition times. In some embodiments, up to 50% of the length of the wires is simultaneously exposed to sputtering from targets, while the rest is exposed to heating from both sides.

In some embodiments, targets will be placed facing each other such that the sputtering station will be free of any heaters, however, it will be preferable to place the targets such that the wire will be heated at least from one side when at a sputtering station.

In operation, wires 132 will be wound around spoolers 138' and 138" which will rotate in the same direction (clockwise in the drawings) to expose the wire continuously, and optionally at constant rate, to the sputtering targets (134). Optionally, all the wires will be wound around a single pair of spoolers; alternatively, several pairs of spoolers will be provided. In one embodiment, each wire will have its own pair of spoolers.

The diameter of the spoolers will be such that safe winding the sapphire wire around them will be allowed. In some embodiments, the diameter of each spooler is 12 inches (about 30 cm). The two spoolers are not necessarily of the same diameter. For example, if it is found that the coated wire is less flexible than the uncoated one, it may be desired to use a larger spooler for collecting the coated wire and a smaller spooler for feeding in the pristine wire.

In some embodiments, the position of the spoolers is vertically adjusted during coating, to ensure that the wires that go from one spooler to the other don't change angle in respect of the heaters, despite of the change occurring in the diameters of the two spoolers because one of them gives wire and the other collects.

In some embodiments, the spoolers will role intermittently, and the wires stay still, for example for several seconds or minutes, and move on. Continuous feeding, however, may result in more uniform coating layers.

In some embodiments, the wires are first coated with one coating (for example, YSZ), then it goes again through system 139, this time with different targets (for example YBCO) and/or different deposition atmosphere inside system 139, and or different heaters temperature. Optionally, the wires will go through the system more times, for example, once for coating the wires with YSZ, once with template layer of YBCO, and once with superconductive YBCO layer. Each such pass may require different targets and/or different atmosphere. Optionally, each such pass will be at a different rate. Optionally, a spooler that will be used as a collecting spooler in one pass will be used as a feed-in spooler in the next pass.

The rate at which the wires move in the apparatus will be set in accordance with the required thickness of the layer to be grown, and size of target that will be exposed to sputtering at one time. For example, if a 300 nm thickness is required, and the deposition rate is 0.03 nm/sec, each wire portion should be exposed to sputtering for 10,000 seconds (about 3 hours). If the distance between the spoolers and the number of the deposition stations along the wire will be such that 1 m of wire will be exposed to sputtering at any given time, the rate at which wire will be fed from one spooler to the other will be 1 meter per 10,000 seconds, or 100 micrometers/sec.

Substrate temperature, chemical composition of targets, and deposition atmosphere will be as described above.

Figures 13C, 13D:
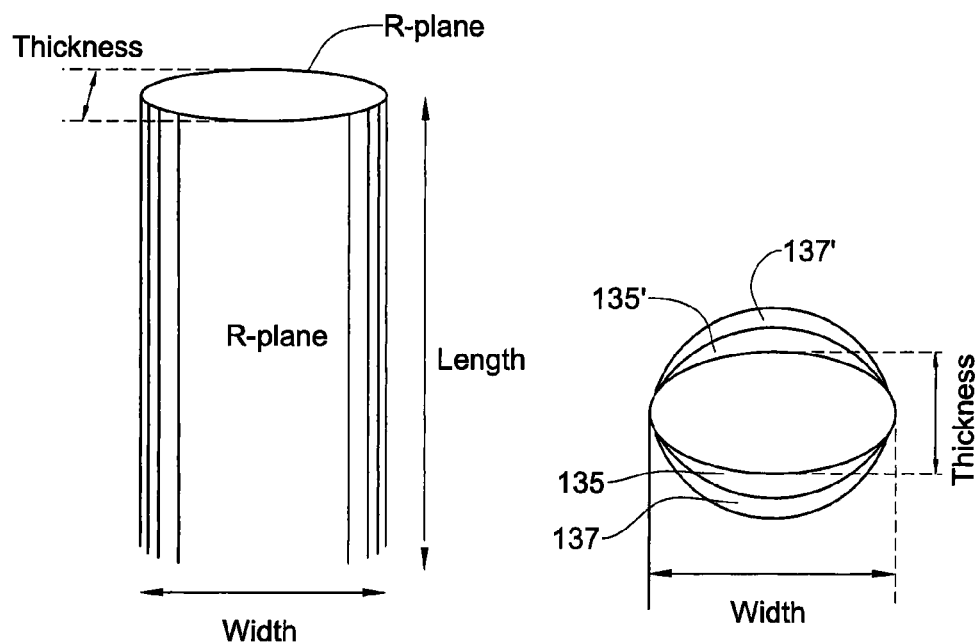
FIG. 13C is a schematic perspective view of an r-cut sapphire wire before coating.
FIG. 13D is a cross-section of a wire obtainable from the wire shown in FIG. 13C by coating it with YSZ and YBCO in accordance with an embodiment of the present invention.

It is expected that coating a wire depicted in FIG. 13C in the manner described herein will result in a wire having a cross-section as depicted in FIG. 13D.

FIG. 13C is a schematic perspective view of an r-cut sapphire wire before coating, obtainable in accordance with the teachings of Goyal.

FIG. 13D is a cross-section that the same wire is expected to have after it will be coated with YSZ and YBCO in accordance with an embodiment of the present invention. FIG. 13D is also schematic, and not in scale. The figure shows YSZ layer 135 and YBCO layer 137 coated on one side of the wire, and layers 135' and 137' on the other side. In embodiments where the two sides of the wire can be coated independently of each other, the thicknesses of the various layers, as well as their chemical compositions, may be different at the two sides of the wires. For example, a wire having the same thickness of YSZ on both sides, but different thicknesses of YBCO may be obtained by using a system as depicted in FIG. 13B, applying on both sides the same number of YSZ targets, but different numbers of YBCO targets.

Exemplary Applications

RF antenna

Figure 11:
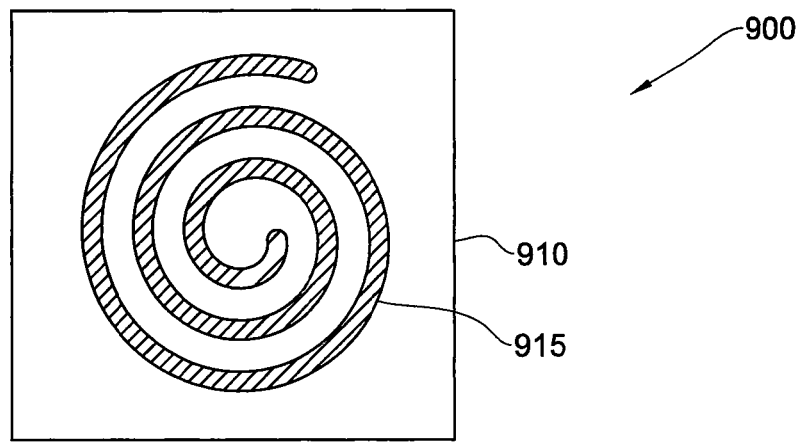
FIG. 11 is a schematic illustration an RF antenna according to an exemplary embodiment.

An YBCO layer according to an embodiment of the invention is optionally used as and RF antenna, that is, RF emitter, receiver, or transceiver. In one example, the RF antenna is of an MRI device. FIG. 11 is a schematic illustration an RF antenna (900) according to an exemplary embodiment. The figure shows a substrate 710, which optionally is an r-cut sapphire, having a surface area of between about 10 and 100 $cm^2$; and on substrate 910 and YBCO super conducting layer 915. Optionally, layer 915 is formed in two stages: at first, substrate 910 is coated with an YBCO layer as described herein (see, for example, layer 6 in FIG. 1), and then, a portion of the layer is removed, to provide a layer of a spiral shape as shown. In other embodiments, the shape of the remaining layer is different, and is limited, if at all, by the ability to precisely remove portions of YBCO layer 910. Removal of a layer portion is optionally carried out using lithography, for example, light lithography, ion lithography, or e-beam lithography. Optionally, the applied lithographic technique uses dry etching; alternatively or additionally, the applied lithographic technique used wet etching, for example, with $H_3PO_4$.

The thickness of layer 915 is preferably at least twice the penetration depth, which is the depth to which RF radiation to be emitted and/or received by the antenna penetrates into the layer. In one example, the penetration depth is 150 nm and the width of layer 915 is 300 nm or more, for example, 450 nm. Preferably, the protective layer (8 in FIG. 1) is YSZ, so as to make the antenna stronger than if other protective layer, such as $CeO_2$ is used.

Exemplary Fault Current Limiter

Figure 12:
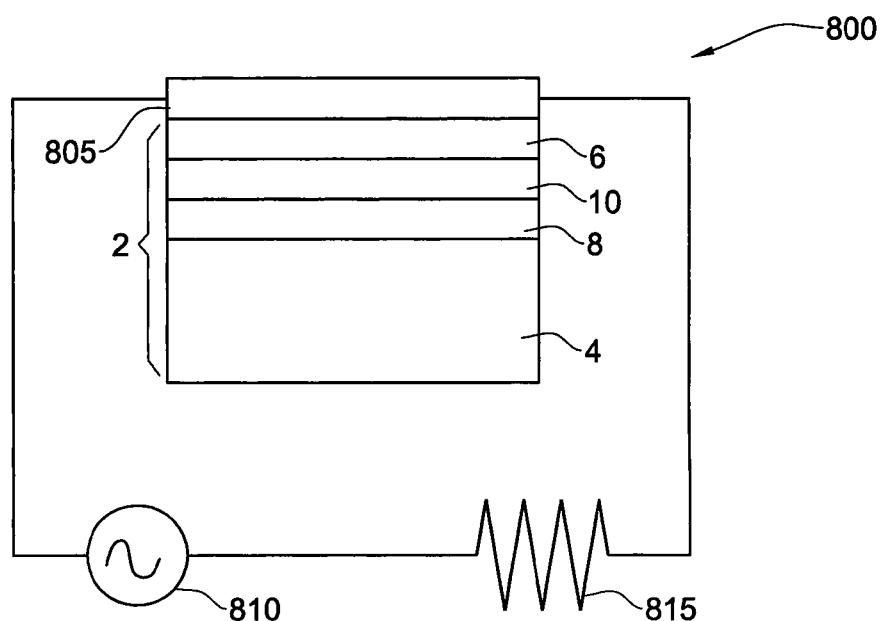
FIG. 12 is a schematic illustration of a Fault Current limiter (FCL) according to an embodiment of the invention.

FIG. 12 is a schematic illustration of a Fault Current limiter (FCL) according to an embodiment of the invention. FCL 800 comprises an article 2 as described in FIG. 1, and on the superconductive layer 6, a conducting (but not super conducting) layer 805, made of, for example, gold. Layer 805 optionally has thickness of 100-300 nm.

In the figure, FCL 800 is connected in series to an electrical circuit comprising a power source 810, and a power consumer 815. Power source 810 is optionally an AC source.

In operation, the current goes through layer 6 when it is below the critical current of the superconducting layer, and through the regularly conducting layer 805—otherwise.

The length of FCL 800 (see L in FIG. 1) is optionally 5 cm or more, such that the electrical resistance of layer 805 is sufficiently large not to short-circuit the electrical circuit, when the current in the circuit is above the critical current of layer 6.

Optionally, the superconductive layer 6 of FCL 800 is very thick, for example, 600 nm, 800 nm, 1000 nm, or more. Additionally or alternatively, the critical current is very high, for example, more than 100 A/cm width, optionally 200 A/cm width, or more.

It should be noted that although throughout this application various embodiments are described using a range format, whenever a numerical range is indicated herein, it is meant to include any cited numeral (fractional or integral) within the indicated range, including the two ends of the range. The phrases "between" a first indicate number and a second indicate number and "from" a first indicate number "to" a second indicate number are used herein interchangeably and are meant to include the first and second indicated numbers and all the fractional and integral numerals therebetween.

It is appreciated that certain features, which are, for clarity, described in the context of separate embodiments, may also be provided in combination in a single embodiment. Conversely, various features, which are, for brevity, described in the context of a single embodiment, may also be provided separately or in any suitable subcombination or as suitable in any other described embodiment of the invention. Certain features described in the context of various embodiments are not to be considered essential features of those embodiments, unless the embodiment is inoperative without those elements.

The invention claimed is:

1. An article comprising:
   an r-cut sapphire substrate carrying a structure comprising:
      a YSZ layer on the substrate;
      a first, template, layer of a compound of the formula $YBa_2Cu_3O_{7-x}$ (YBCO), on the YSZ layer; and
      a second superconductive layer of YBCO on the first YBCO layer,
   wherein the first layer of YBCO serves as a template layer to provide a desire relation between c lattice parameters and thickness of the first layer YBCO and the second layer of YBCO, enabling the second superconductive layer of YBCO to be desirably thick thereby providing high critical current density of the superconductive layer, the first template layer having a thickness substantially not exceeding 50 nm and having the c lattice parameter of at least 1.175 nm being therefore non-superconductive at temperature above at least 77K, and the second superconductive layer of YBCO having a the thickness of at least 300 nm and having the c lattice parameter of between 1.1169 and 1.171 nm.

2. An article according to claim 1, wherein said second layer of YBCO has surface area between 10cm$^2$ and 100cm$^2$.

3. An article according to claim 1, wherein the substrate is an r-cut sapphire wire.

4. An article according to claim 3, wherein the wire has length of between 1 m and 1000 m.

5. An article according to claim 1, wherein said second layer of YBCO has thickness of between 10 nm and 50 nm.

6. An article according to claim 1, wherein said second layer of YBCO has thickness of between 600 nm and 1500 nm.

7. An article according to claim 1, further comprising, on the layer of YBCO, one or more bi-layered structures, where each bi-layered structure is configured as defined in claim 1, and the bi-layered structures are located one on top of the other.

8. An electrical circuitry comprising a power consumer connectable to a power source through a conductor, wherein said conductor comprises an article according to claim 1.

9. An article comprising:
   an r-cut sapphire substrate with an YSZ layer thereon prepared by heating the substrate to a substrate temperature above 680° C. and sputtering YSZ onto the heated substrate under an atmosphere consisting essentially of oxygen; and
   a first layer of YBCO on the YSZ layer, wherein the surface area of each of the YSZ layer and the YBCO layer is between 10 cm$^2$ and 100 cm$^2$, and a second superconductive layer of YBCO on the YBCO layer, wherein the first layer of YBCO serves as a template layer for the second YBCO layer to provide desired relations between c lattice parameters and thicknesses of the first layer of YBCO an the second layer of YBC, enabling the second superconductive layer of YBCO to be desirably thick thereby providing high critical current density of the superconductive layer, the first template layer having a thickness substantially not exceeding 50 nm and having the c lattice parameter of at least 1.175 nm being therefore non-superconductive at temperature above at least 77K and the second superconductive layer of YBCO having a thickness of at least 300 nm and having the c lattice parameter of between 1.1169 and 1 171 nm.

* * * * *